United States Patent [19]

Pelowski et al.

[11] Patent Number: 4,493,002

[45] Date of Patent: Jan. 8, 1985

[54] ELECTRONIC CIRCUIT BREAKER

[75] Inventors: Kenneth R. Pelowski, Bloomfield Township, Oakland County; Robert J. Winkel, Royal Oak, both of Mich.

[73] Assignee: Westinghouse Electric Corp., Pittsburgh, Pa.

[21] Appl. No.: 470,651

[22] Filed: Feb. 28, 1983

[51] Int. Cl.³ ............................................. H02H 3/08
[52] U.S. Cl. ..................................... 361/93; 361/94; 361/101; 307/125
[58] Field of Search ................... 361/100, 98, 101, 94, 361/93, 87, 86, 88, 31; 307/125, 126, 131, 448, 468

[56] References Cited

U.S. PATENT DOCUMENTS

| | | | |
|---|---|---|---|
| 4,375,073 | 2/1983 | Glogolja et al. | 361/98 X |
| 4,404,473 | 9/1983 | Fox | 361/98 X |
| 4,415,945 | 11/1983 | Periot | 361/100 |
| 4,428,016 | 1/1984 | Brasfield | 361/100 X |

*Primary Examiner*—Patrick R. Salce
*Attorney, Agent, or Firm*—M. J. Moran

[57] ABSTRACT

A versatile output card circuit capable of switching a wide range of voltage levels for use with the central processing unit of a computer or microprocessor controller. The versatile output circuit includes an isolation switching means circuit for electrically isolating a second predetermined range of load voltage while responding to a first predetermined range of signal output voltage by switching the second predetermined range of load voltage to a desired load and an indicating means circuit coupled to and responsive to the isolation switching means circuit for indicating when the second predetermined range of load voltage has been switched to the load.

1 Claim, 1 Drawing Figure

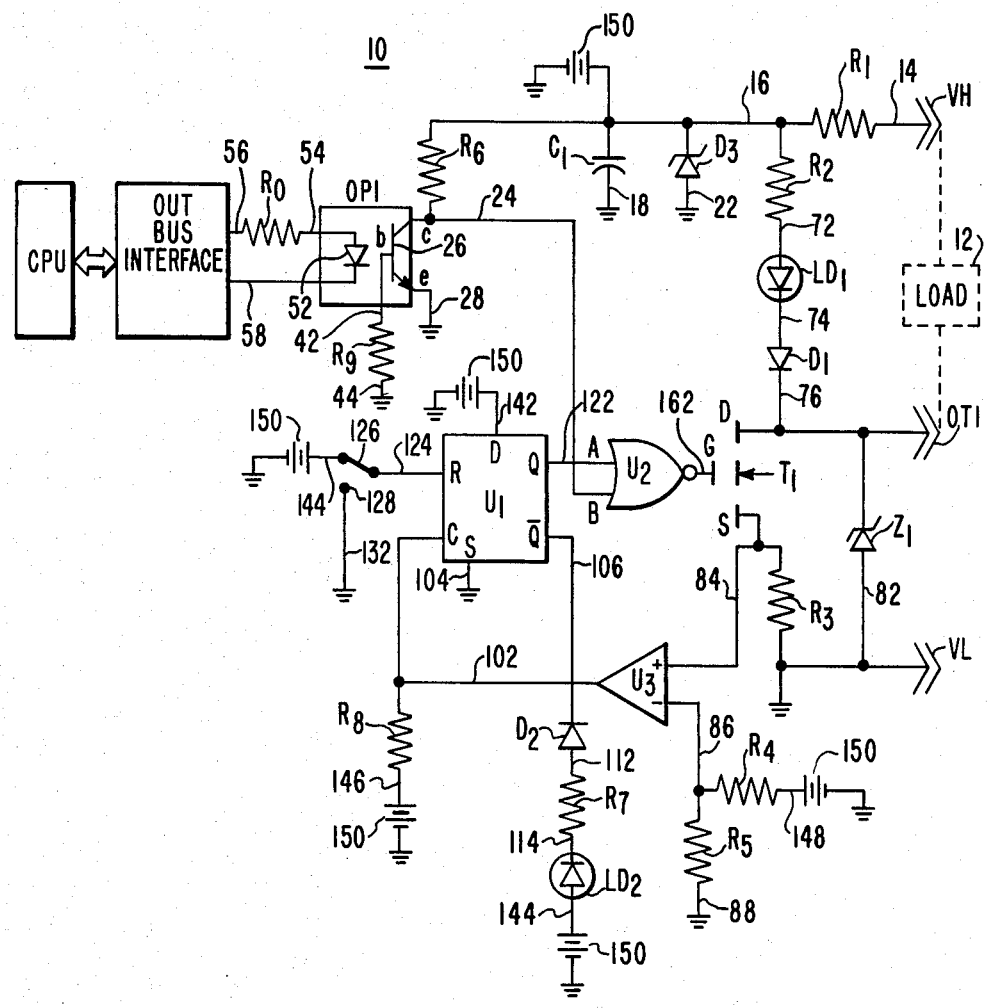

ELECTRONIC CIRCUIT BREAKER

CROSS-REFERENCE TO RELATED APPLICATIONS

This application is related to application Ser. No. 470,549 entitled "A Versatile Output Card For Computer Or Microprocessor Controller", and application Ser. No. 470,647 entitled "Versatile Input Circuit For Sensing The Status Of A Voltage Input Over A Wide Range Of Voltage Levels And Waveforms", by the same inventors and assigned to the same assignee as the present application.

BACKGROUND OF THE INVENTION

1. Field of the Invention

The invention relates in general to an output card suitable for interfacing a load with the central processing unit of a computer or microprocessor controller and more particularly to an output card having a solid state current sink with an electronic circuit breaker.

2. Description of the Prior Art

Conventional fuse and circuit breakers comprise a resistive element that is sized to either melt, in the case of a fuse, or heat up to trip the circuit breaker under predetermined current conditions. The heating of the resistive element before the conventional fuse or circuit breaker disconnects the circuit from the load generally requires an appreciable time interval on the order of $50 \times 10^{-3}$ seconds. In the case of a fuse another disadvantage is its maintenance cost. A stock of fuses must be inventoried for replacement and maintenance time is increased for the physical replacement of the fuse. Another disadvantage for both the fuse and circuit breaker is that upon disconnection, often times the operator has no way of knowing that the fuse has melted or the circuit breaker has tripped. Accordingly it would be desirable to have a fast acting electronic circuit breaker that may be reset by a simple switch and would give an indication when the electronic circuit breaker has been triggered and in addition an indication when the circuit is in proper operation. Furthermore it would be desirable for the electronic circuit breaker to incorporate a current sink i.e. a "current sink" output. A "current sink" output is technological shorthand for "providing a current path back to the supply or zero potential point".

SUMMARY OF THE INVENTION

Briefly the present invention is a fast acting electronic circuit breaker that is magnitudes faster than any conventional fuse or circuit breaker. Depending upon circuit conditions and discrete component selections the electronic circuit breaker of the present invention will operate to disconnect a load circuit within $50 \times 10^{-6}$ to $50 \times 10^{-9}$ seconds. The electronic circuit breaker of the present invention comprises a field activated semiconductor switch such as, for example, a field effect transistor or more particularly a metal oxide semiconductor field effect transistor, means for causing the field actuated semiconductor switch to be conductive in response to a first predetermined signal, which may be for example, a suitably conditioned output signal of a central processing unit of a computer or microprocessor controller, and means for causing the field activated semiconductor switch to be nonconductive at times when the load current exceeds a predetermined value. The means for causing the field activated semiconductor switch to be conductive includes a means for isolating and responding to the first predetermined signal which may be for example an optocoupler and a CMOS logic circuit for conditioning the output signal of the optocoupler to provide the correct field signal to the field activated semiconductor switch. The means for causing the field activated semiconductor switch to be nonconductive includes means for sensing the load current and in particular when load current exceeds the first predetermined value, and means for coupling this sensed signal through a CMOS logic circuit to remove the field signal which activates the semiconductor switch of the invention. The electronic circuit breaker of the invention further includes indicating means for indicating when power is provided to the load under normal operating conditions and indicating means for indicating when the circuit breaker has disconnected the load.

BRIEF DESCRIPTION OF THE DRAWING

The invention may be understood and further advantages and uses thereof more readily apparent, when considered in view of the following detailed description of the exemplary embodiment, taken with the accompanying drawing in which FIG. 1 shows a schematic diagram of the electronic circuit breaker constructed according to the teachings of the invention.

DESCRIPTION OF THE PREFERRED EMBODIMENT

Referring now to FIG. 1 there is shown the electronic circuit breaker 10 constructed according to the teachings of the invention. Electronic circuit breaker 10 includes output terminals VH, OT1, and VL respectively adapted for connection to the high voltage terminal of a load circuit, the low voltage terminal of a load circuit and ground, respectively. A load circuit is shown generally at 12 connected between VH and OT1. Terminal VH is then coupled over conductor 14 to one end of resistor R1 with the other end of resistor R1 being coupled over conductor 16 to one end of resistor R2, the cathode terminal of voltage clamping means D3 which may be for example a zener diode, one end of capacitor C1 and one end of resistor R6. The other end of capacitor C1 and the anode terminal of voltage clamping means D3 are coupled to ground over conductors 18 and 22 respectively. The other end of resistor R6 is coupled over conductor 24 to the collector terminal of photosensitive NPN junction type transistor 26 having base collector and emitter electrodes B, C, and E respectively. The emitter electrode of photosensitive transistor 26 is coupled over conductor 28 to ground and the base electrode of photosensitive transistor 26 is coupled over conductor 42 to one end of resistor R9 with the other end of resistor R9 being coupled over conductor 44 to ground. Photosensitive transistor 26 along with photodiode 52 which may be, for example, a light emitting diode comprise the output and input respectively to isolation switching means OP1 which may be for example an optocoupler. The anode terminal of photo diode 52 is coupled over conductor 54 to one end of resistor R6 with the other end of resistor R6 being coupled over conductor 56 and the cathode terminal of photodiode 52 is coupled over conductor 58 to the output bus interface of a central processing unit of a computer or microprocessor controller shown generally in FIG. 1 at the labeled rectangular boxes. The other end of resistor R2 is coupled over conductor 72 to the anode terminal of indicating means LD1 which may be for example a light emitting diode with the cathode terminal of light emitting diode LD1 being coupled over conductor 74 to the anode terminal of a power limiting or separating device D1 which may be for example a diode with the cathode terminal of diode D1 being coupled over conductor 76 to terminal OT1, and the cathode terminal of voltage clamping means Z1 which may be for example a Tranzorb or zener diode or other voltage clamping means. The anode terminal of voltage clamping means or transorb ZI being coupled over conductor 82 to terminal VL, ground, and one end of resistor R3. The other end of resistor R3 is coupled over conductor 84 to the noninverting terminal of comparator means U3 which may be for example a differential amplifier well known in the art. The inverting terminal of comparator means U3 is coupled over conductor 86 to one end of resistors R4 and R5 respectively with the other end of resistor R5 being coupled over conductor 88 to ground. The output terminal of comparator means U3 is coupled over conductor 102 to one end of resistor R8 and clock input terminal C of D flip-flop means U1. The set terminal of D flip-flop means U1 is coupled over conductor 104 to ground while the complement output terminal $\bar{Q}$ of D flip-flop means U1 is coupled over conductor 106 to the cathode terminal of power limiting means D2 which may be for example a diode. The anode terminal of power limiting means or diode D2 is coupled over conductor 112 to one end of resistor R7 with the other end of resistor R7 being coupled over conductor 114 to the cathode terminal of indicating means LD2 which may be for example a light emitting diode. The true output Q terminal of the flip-flop means U1 is coupled over conductor 122 to the A terminal of NOR means U2 which may be for example an integrated NOR function circuit with the B or second input terminal being coupled over conductor 24 to one end of resistor R6 and the collector of photosensitive transistor 26 of isolation switching means OP1. The reset transistor R of D flip-flop means U1 is coupled over conductor 124 to reset switch 126 having reset terminal 128 coupled over conductor 132 to ground. The data input terminal D of the flip-flop logic means U1 is coupled over conductor 142, reset switch 126 is coupled over conductor 144, the anode terminal of indicating means or light emitting diode LD2 is coupled over conductor 144, the other end of resistor R8 is coupled over conductor 146, the other end of resistor R4 is coupled over conductor 148, and conductor 16 are all coupled over to the positive terminals of a source of direct current potential (the same or different potentials), represented in general by a battery 150 in FIG. 1, but which may be bridge rectifiers connected to a source of alternating potential if desired. The negative terminals of direct current potentials 150 may be connected to ground. The output terminal of NOR logic means U2 is coupled over conductor 162 to the gate terminal, conductor 76 is coupled over to the drain terminal, and conductor 84 is coupled over to the source terminal respectively of field activated semiconductor switch T1 which may for example be a field effect transistor or more specifically a metal oxide semiconductor field effect transistor well known in the art.

Operation begins when the proper voltage is present between VH and VL and the CPU sends a message to the output bus interface. The message will result in enough voltage and current to activate the optocoupler OP1, switching its photosensitive transistor 26 into saturation. This causes NOR means U2 to provide the correct potential to the gate terminal G of field activated semiconductor switch or MOS FET T1 causing current to be passed through to the external load (via terminal VH, the load circuit represented generally at 12, terminal OT1, along conductor 76 through field activated semiconductor switch or MOS FET TI) and resistor R3. Note that when field activated secondary switch or MOS FET TI becomes conductive, indicating means or light emitting diode LD1 is also turned on. Under a high current fault condition, the voltage across resistor R3 increases. When this voltge becomes greater than the reference voltage at the inverting terminal of comparator means U3, comparator means U3's output switches. This changes the state of the D flip-flop means U1, which causes the field activated semiconductor switch or MOS FET T1 to become nonconductive by means of NOR logic means U2. When the state of D flip-flop logic means U1 changes to cause the field activated semiconductor switch or MOS FET TI to become nonconductive, the true output terminal Q goes low while the complementary output terminal $\bar{Q}$ goes high thereby activating indicating means circuit (LED LD2) circuit to provide a positive indication that the electronic circuit breaker of the invention has tripped or become nonconductive which positive indication of course is transmitted to an operator.

It can be readily understood that R3 functions as the sensing means to sense when the load current exceeds a predetermined value by providing the correct voltage input to the noninverting terminal of comparator logic means U3. To prevent unnecessary tripping of electronic circuit breaker 10 an RC filter circuit with a suitable time constant may be coupled between conductor 84 and ground. The voltage clamping means or zener diode D3 and capacitor C1 are used to produce a predetermined voltage level. The voltage clamping means or zener diode D3 clamps the internal supply voltage to its zener level, while resistor R1 limits the current flow. The capacitor C1 insures that any change in circuit current does not affect the predetermined voltage level which may be for example 10 volts DC. This voltage level is needed to power all integrated circuits.

This solid state electronic circuit breaker circuit is unique compared to fuses or circuit breakers of the previous art because it is a resettable electronic circuit breaker which is faster than any conventional fuse or circuit breaker. The ability to clamp the internal supply voltage to a constant DC predetermined level enables the circuit to use a variable external supply. The integrated circuits monitor the load current and protect the output device from dangerous current levels. The electronic circuit breaker of the invention protects many components which would otherwise be destroyed if conventional circuit breakers or fuses were used for current protection because of the speed in which the electronic circuit breaker of the invention trips. As mentioned earlier its speed is on the order of $50 \times 10^{-6}$ to $50 \times 10^{-9}$ depending on component selection and circuitry. The circuit of the preferred embodiment disclosed in FIG. 1 is capable of conducting between 0 amperes and 2 amperes at voltage levels between 12 and 48 volts DC. The electronic circuit breaker's main advantage is its speed. It is magnitudes faster than any conventional fuse or circuit breaker. Therefore, loads and components can now be protected which previously would have been destroyed. Another advantage is its maintenance cost savings. Since the circuit can be reset by a switch, no stock is needed for replacement fuses and maintenance time is reduced. Furthermore an LED indicator is activated when the circuit breaker is triggered. This insures that the fault is transmitted to the operator.

Although certain values have been disclosed by way of explanation with regard to the preferred embodiment of the invention, the teaching of the invention is not to be so limited but rather is widely applicable to other values depending upon component selection.

We claim:

1. Solid state electronic circuit breaker apparatus comprising:
   (a) an electric field activated semiconductor switching means;
   (b) an electrically isolating optocoupler for responding to a first predetermined signal for activating logic circuit means for providing a first predetermined electric field level to said electric field activated semiconductor switching means to activate said electric field activated semiconductor switching means; and
   (c) resistor means connected in series circuit relationship with the output of said electric field activated semiconductor switching means for providing a signal to a comparator means for switching the output of the comparator means when the voltage across said resistor means exceeds a predetermined value as a function of load current flowing therethrough the output of said comparator means is connected to the input of a flipflop means for causing said flipflop means to change state to in turn energize a NOR logic means to change state. The output of said NOR logic means being interconnected with said electric field activated semiconductor switching means and the input of said NOR logic means being connected to said optocoupler means and said flipflop means for overriding said optocoupler means for causing said electric field activated semiconductor switching means to become nonconductive when load current as measured across said resistor means exceeds a predetermined value.

* * * * *